(12) United States Patent
Lowrey

(10) Patent No.: US 7,566,646 B2
(45) Date of Patent: Jul. 28, 2009

(54) THREE DIMENSIONAL PROGRAMMABLE DEVICE AND METHOD FOR FABRICATING THE SAME

(75) Inventor: Tyler A. Lowrey, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 141 days.

(21) Appl. No.: 11/810,227

(22) Filed: Jun. 4, 2007

(65) Prior Publication Data

US 2007/0238226 A1 Oct. 11, 2007

Related U.S. Application Data

(60) Division of application No. 10/231,974, filed on Aug. 30, 2002, now Pat. No. 7,247,876, which is a continuation-in-part of application No. 09/608,162, filed on Jun. 30, 2000, now Pat. No. 6,501,111.

(51) Int. Cl.
*H01L 21/44* (2006.01)
(52) U.S. Cl. .................. 438/597; 438/618; 438/629
(58) Field of Classification Search ............ 438/597, 438/618, 620, 622, 629
See application file for complete search history.

(56) References Cited

U.S. PATENT DOCUMENTS

| 4,366,108 | A | 12/1982 | Urech et al. |
|---|---|---|---|
| 4,528,305 | A | 7/1985 | Henry |
| 4,680,076 | A | 7/1987 | Bard |
| 5,011,721 | A | 4/1991 | Decker et al. |
| 5,985,431 | A | 11/1999 | Oosedo et al. |
| 6,410,127 | B1 | 6/2002 | Kamae et al. |
| 6,596,373 | B1 | 7/2003 | Kishi et al. |
| 6,621,095 | B2 * | 9/2003 | Chiang et al. .............. 257/5 |
| 6,838,176 | B2 | 1/2005 | Goto et al. |
| 6,875,825 | B2 | 4/2005 | Kaneko et al. |

FOREIGN PATENT DOCUMENTS

| EP | 0 262 891 A2 | 4/1988 |
|---|---|---|
| EP | 1094087 A1 | 4/2001 |
| EP | 1 116 774 A2 | 7/2001 |
| JP | 5-132540 | 5/1993 |
| JP | 8-176325 | 7/1996 |
| JP | 10-182793 | 7/1998 |
| WO | WO-01/27190 A1 | 4/2001 |
| WO | WO-01/81445 A1 | 11/2001 |

* cited by examiner

*Primary Examiner*—Kevin M Picardat
(74) *Attorney, Agent, or Firm*—Trop, Pruner & Hu, P.C.

(57) ABSTRACT

A three-dimensional memory device having polycrystalline silicon diode isolation elements for phase change memory cells and method for fabricating the same. The memory device includes a plurality of stacked memory cells to form a three-dimensional memory array. The polycrystalline silicon diode element selects the phase change memory cell. The memory device is fabricated by forming a plurality of phase change memory cells and diode isolation elements on a base layer. Additional layers of memory cells and isolation elements are formed over the initial layer.

5 Claims, 5 Drawing Sheets

THREE DIMENSIONAL PROGRAMMABLE DEVICE AND METHOD FOR FABRICATING THE SAME

CROSS-REFERENCE TO RELATED APPLICATIONS

This application is a Divisional of U.S. patent application Ser. No. 10/231,974, filed Aug. 30, 2002 now U.S. Pat. No. 7,247,876, which is a Continuation-In-Part of application Ser. No. 09/608,162 now U.S. Pat. No. 6,501,111, filed Jun. 30, 2000 by applicant, Tyler A. Lowrey entitled "Three-Dimensional (3D) Memory Device Having Polysilicon Diode Isolation Elements for Chalcogenide Memory Cells and Method for Fabricating the Same."

FIELD

Programmable memory devices and methods for fabricating the same.

DESCRIPTION OF THE RELATED ART

Typical memory applications include dynamic random access memory (DRAM), static random access memory (SRAM), erasable programmable read only memory (EPROM), and electrically erasable programmable read only memory (EEPROM).

Solid state memory devices typically employ micro-electronic circuit elements for each memory bit (e.g., one to four transistors per bit) in memory applications. Since one or more electronic circuit elements are required for each memory bit, these devices may consume considerable chip "real estate" to store a bit of information, which limits the density of a memory chip. The primary "non-volatile" memory element of these devices, such as an EEPROM, typically employ a floating gate field effect transistor device that has limited re-programmability and which holds a charge on the gate of field effect transistor to store each memory bit. These classes of memory devices are also relatively slow to program.

Phase change memory devices use phase change materials, i.e., materials that can be electrically switched between a generally amorphous and a generally crystalline state, for electronic memory application. One type of memory element developed by Energy Conversion Devices, Inc. of Troy, Mich. utilizes a phase change material that can be, in one application, electrically switched between a structural state of generally amorphous and generally crystalline local order or between different detectable states of local order across the entire spectrum between completely amorphous and completely crystalline states. Typical materials suitable for such application include those utilizing various chalcogenide elements. These electrical memory devices typically do not require field effect transistor select devices, and comprise, in the electrical context, a monolithic body of thin film chalcogenide material. As a result, very little chip real estate is required to store a bit of information, thereby providing for inherently high density memory chips. The state change materials are also truly non-volatile in that, when set in either a crystalline, semi-crystalline, amorphous, or semi-amorphous state representing a resistance value, that value is retained as that value represents a physical state of the material (e.g., crystalline or amorphous). Thus, phase change memory materials represent a significant improvement in non-volatile memory.

One characteristic common to solid state and phase change memory devices is significant power consumption particularly in setting or resetting memory elements. Power consumption is significant, particularly in portable devices that rely on power cells (e.g., batteries). It would be desirable to decrease the power consumption of a memory device.

Another characteristic common to solid state and phase-change memory devices is that they are formed on or in the top surface of a substrate. Solid state transistors formed in or on the top surface of a substrate have addressing circuitry overlying the top of the transistor. These devices generally require the use of the top surface of the substrate and are formed in a two dimensional array over the substrate surface.

BRIEF DESCRIPTION OF THE DRAWINGS

Various embodiments are illustrated by way of example and not by way of limitation in the figures of the accompanying drawings in which like references indicate similar elements. It should be noted that references to "an," "one," or "various" embodiments in this disclosure are not necessarily to the same embodiment, and such references mean at least one.

DETAILED DESCRIPTION

Figure 1:
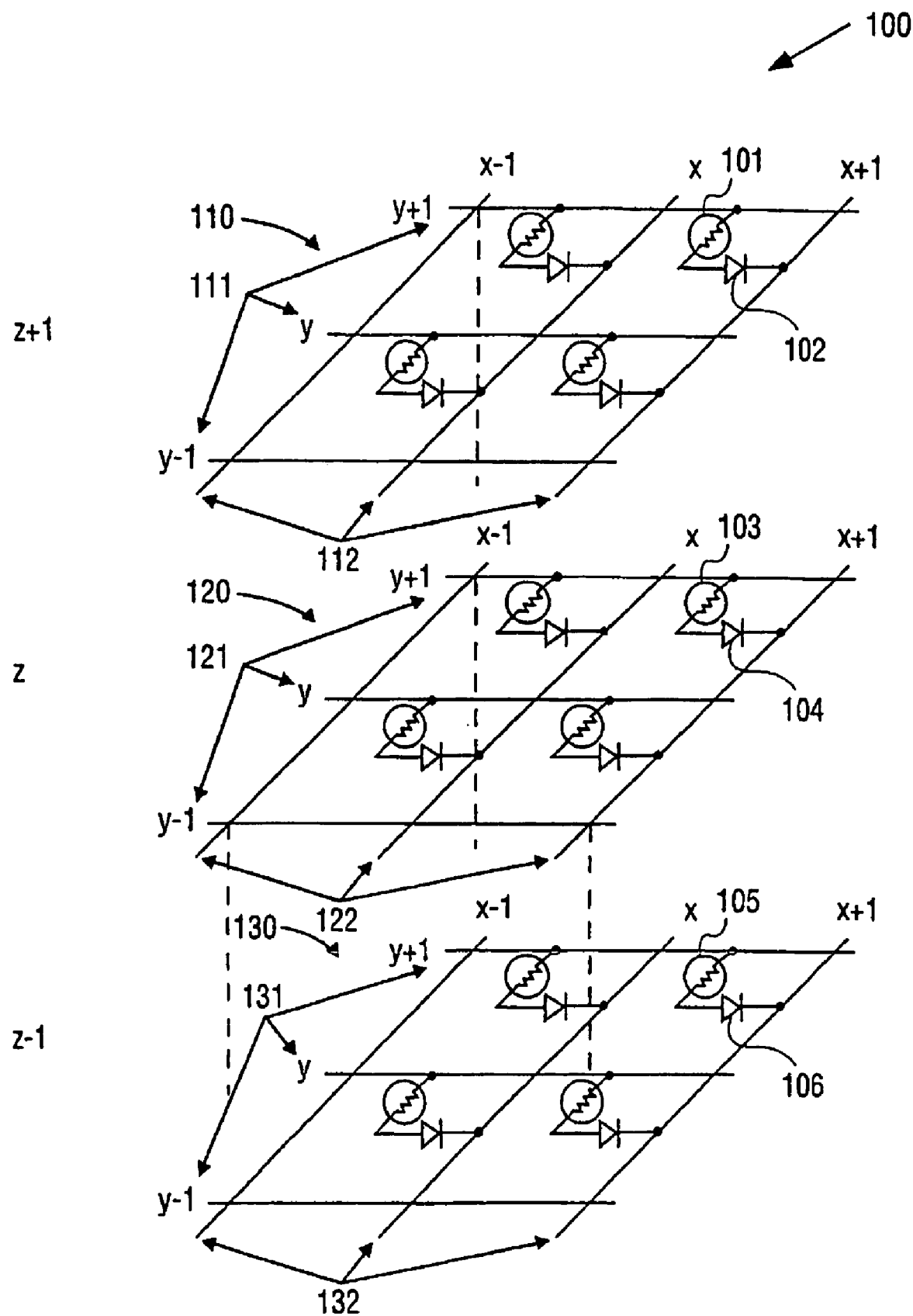
FIG. 1 illustrates a three dimensional circuit diagram of one embodiment.

FIG. 1 shows a schematic diagram of an embodiment of a memory array comprised of a plurality of memory elements. Memory array 100 may be incorporated for example, in a dedicated memory chip or as a memory component of a microprocessor. In this example, the circuit of memory array 100 includes an xyz grid with memory elements (representatively memory element 101) electrically interconnected in series with isolation devices (representatively isolation device 102) in multiple layers (e.g., multiple planes) on a portion of a substrate such as a chip. Representatively, memory element 101 and isolation device 102 are associated with layer 110 on a portion of a chip. Address lines 111 (e.g., columns) and 112 (e.g., rows) for layer 110 are connected, in one embodiment, to addressing circuitry external to the array to address respective ones of memory elements (e.g., memory element 101) of layer 110 to, for example, read or write to the memory elements. The isolation devices (e.g., isolation device 102) serve in one aspect to restrict electrical access to the memory elements. Layers 120 and 130 may be similarly arranged as layer 110 with respective address lines 121, 122, 131 and 132 connected to the addressing circuitry. Additional memory elements, isolation elements and layers can be added in other embodiments. One purpose of the xyz grid array of memory elements in combination with isolation devices is to enable each discrete memory element to be read and written without interfering with the information stored in adjacent or remote memory elements of the array. Memory elements with different z coordinates (memory elements in different layers) are read from and written to by selecting row and column address lines from the appropriate layer (e.g. to select memory element 103 in layer 120 the x+1 row of rows 122 and the y+1 column of columns 121 are asserted). The addressing circuitry is connected to each layer and is configured to select the appropriate layer to access a given memory element. It is appreciated and it will become clearer later that each layer or plane (e.g., layer 110, layer 120, layer 130), although represented in an xz plane, may have a y-dimension component as well.

Figure 2A:
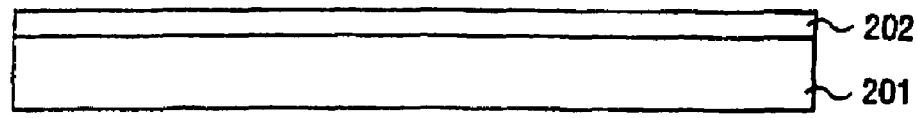
FIG. 2A schematically illustrates a cross-sectional planar side view of one embodiment showing the substrate and overlying conductor.

FIGS. 2A-E illustrate the fabrication of representative memory element 101 and isolation device 102 of FIG. 1. FIG. 2A shows a portion of substrate 201 that is, for example, a semiconductor substrate. A typical substrate includes a semiconductor substrate such as a silicon substrate. In one embodiment, silicon substrate 201 has a thickness of 10 to 50 mils, for example 25 mils. Other substrates including, but not limited to, substrates that contain ceramic material, organic material, or glass material as part of the infrastructure are also suitable. Alternatively, substrate 201 can be an insulator layer composed of an oxide (e.g., $SiO_2$), nitride (e.g., $Si_3N_4$), polymer (e.g., polymide), undoped polycrystalline silicon, undoped epitaxial silicon or other similar material. Memory array 100 may be fabricated over an area of the substrate at the wafer level and then the wafer reduced through singulation into discrete die or chips, some or all of the die or chips having a memory array formed thereon. Additional addressing circuitry (e.g., decoders, etc.) may also be formed on a portion of substrate 201. In one embodiment, an overlying insulation layer may be formed on the substrate. The insulating film may have a thickness of 200-20,000 angstroms (Å), for example 5,000 Å.

In one embodiment, a low resistivity conductor is formed as a layer on substrate 201 and is patterned to form row line conductors such as row line conductor 202. Row line conductor 202 can be composed of patterned strips of polycrystalline silicon or polycrystalline silicon strapped with tungsten silicide ($WSi_x$), cobalt silicide ($CoSi_2$), titanium silicide ($T_iSi_2$) or similar low resistivity conductors. In one embodiment, the thickness of strapped polycrystalline silicon 202 is 25 to 10,000 Å, for example, approximately 1500 Å. In one embodiment, polycrystalline silicon layer 202 is deposited at a temperature of approximately 600° C. Deposition at this temperature should not affect other structures on substrate 201 such as field effect transistors (e.g., NFETs and PFETs). The polycrystalline silicide strapping process is designed for low temperatures such as, the 600° C.

Figure 2B:
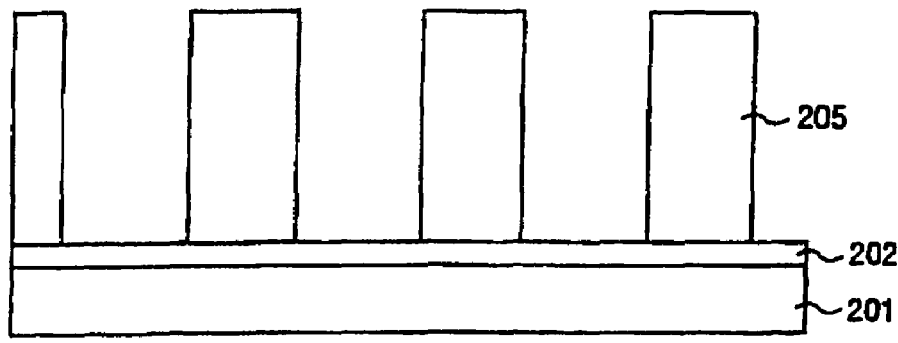
FIG. 2B illustrates the structure of FIG. 2A after formation of shallow trench isolation structures.

FIG. 2B shows insulating structures 205 formed in a dielectric material on conductor 202 and substrate 201. Insulating structures 205 serve to isolate individual memory elements from one another. In one embodiment, insulating structures 205 are formed by chemical vapor deposition (CVD) of an insulating layer such as an oxide over conductor layer 202 and substrate 201 and subsequently etched to create, in one embodiment, roughly cylindrical recesses in the layer using a chemical mechanical polish (CMP), photolithography and dry etching process or by using only photolithography and dry etching processes. In one embodiment, the thickness of the insulating structures 205 is in the range of 200 to 20,000 Å, 5,000 Å. The width of insulating structures 205 is 0.01-1 micrometers (μm), for example 0.20 μm. A representative aspect ratio of the insulating structures 205 is 2.5:1.

Figure 2C:
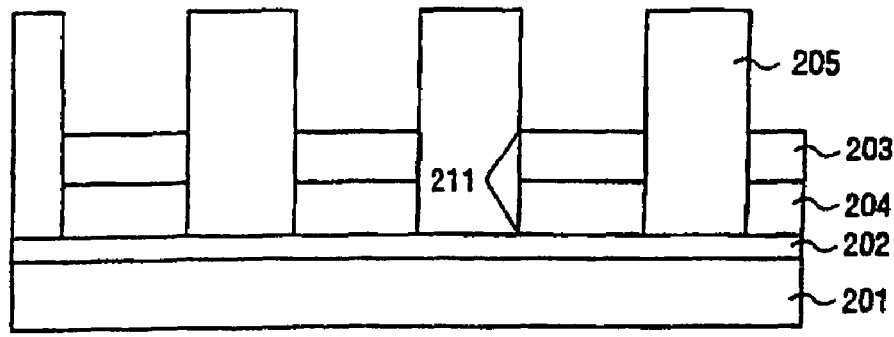
FIG. 2C illustrates the structure of FIG. 2B after formation of an isolation device.

FIG. 2C shows the structure of FIG. 2B after a further fabrication operation in memory cell regions between insulating structures 205. Overlying conductor or signal line material 202 is an isolation device (e.g., isolation device 102 of FIG. 1). In one example, the isolation device is a diode formed by depositing polycrystalline silicon between insulating structures 205. Polycrystalline silicon layer 211 can be further recessed by CMP and dry etching or other suitable techniques. In one example, isolation device 211 is PN diode 211 formed of N-type silicon portion 204 (dopant concentration on the order of about $10^{16}$-$10^{18}$ atoms/cm$^3$) and P-type silicon portion 203 (dopant concentration on the order of about $10^{18}$-$10^{20}$ atoms/cm$^3$). Although a PN diode 211 is shown, it is to be appreciated that other isolation structures are similarly suitable. Such devices include, but are not limited to, metal oxide semiconductor (MOS) devices or metal-insulator-metal (MIM) devices. In one embodiment, the polycrystalline silicon layer of isolation device 211 is deposited by low pressure CVD at a temperature of 600° C. using a $SiH_4$ gas. In one embodiment, the leakage tolerance levels for the isolation device are sufficiently low to allow a distinctive read of the highest resistance state. To minimize effects of diode leakage, an array architecture may be optimized that partitions diode leakage in such a way that the leakage is sufficiently low to allow a distinctive read of the highest resistance state.

Figure 2D:
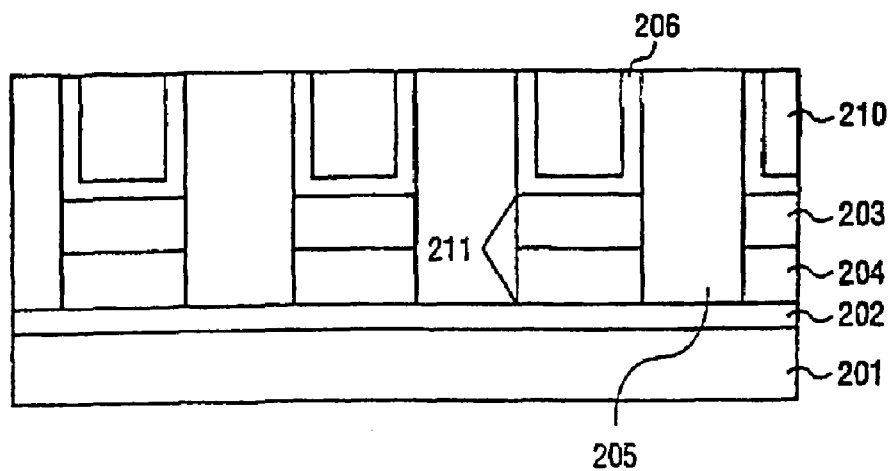
FIG. 2D illustrates the structure of FIG. 2C after forming of electrode material.

Referring to FIG. 2D, overlying the isolation device 211 is electrode material 206. In one example, electrode material 206 is polycrystalline semiconductor material such as polycrystalline silicon. Other suitable materials include carbon and semi-metals such as transition metals including, but not limited to, titanium, titanium-tungsten (TiW), titanium nitride (TiN) and titanium aluminum nitride (TiAlN). The introduction is conformal in the sense that electrode material 206 is introduced along the side walls of insulating structures 205 and overlying isolation structure 211.

In the example where electrode material 206 is semiconductor material such as polycrystalline silicon, following or during the introduction of electrode material 206, a dopant is introduced into the polycrystalline silicon to, in one aspect, lower the resistance of the material. In this example, a suitable dopant is a P-typed dopant such as boron introduced to a concentration on the order of about $10^{18}$-$10^{20}$ atoms/cm$^3$. In one embodiment, the dopant is introduced at an angle such that electrode material 206 along only a portion of the sidewalls of insulating structures 205 (a first sidewall portion) is primarily exposed to the dopant while electrode material along another portion of the sidewall (a second sidewall portion) is exposed to little or no dopant. The sidewalls of the insulating structures 205 define a cylindrical opening. In this manner, the resistance of electrode material along the first sidewall portion may be reduced below the resistance of electrode material along the second sidewall portion. In the case of polycrystalline silicon, in one example, electrode material along the second sidewall portion is substantially intrinsic silicon. Dopant introduction, such as an implantation, is done at an angle, α, of approximately 60° from horizontal to introduce a dopant (e.g., P-typed dopant) into electrode material along the first sidewall portion to the significant exclusion of electrode material along the second sidewall portion.

In another embodiment, electrode material along the first sidewall portion is counter-doped. A first dopant introduced along a portion of electrode material on the first sidewall portion (again at an angle) adjacent isolation structure 211 is of a first type (e.g., $P^+$-type). A second dopant may be introduced at the top portion of electrode material along the first sidewall portion of a second type (e.g., $N^+$-type). In the example of P+-type and N+-type counter-doping, the different portions of electrode material along the first sidewall portion have different levels of charge carriers (e.g., N+-type portion>P+-type portion). The difference in charge carriers generally modifies the resistance of the electrode so that the resistance of the electrode can be increased near that portion adjacent a volume of phase-change material. U.S. patent application Ser. No. 09/620,318, filed Jul. 22, 2000, titled "Electrically Programmable Memory Element Having Sidewall Contact and Method for Making Same" describes a counter-doped electrode material.

FIG. 2D also shows the structure after the introduction of insulator material 210 overlaying the electrode material between insulating structures 205 and a planarization of electrode material 206, insulator material 210 and insulating structures 205. Suitable planarization techniques include those known to those of skill in the art, such as dry etching or CMP techniques.

In one embodiment a modifying species is introduced into a portion of electrode material 206 at the first sidewall portion. In one example, the modifying species is a chemical modifier that combines or reacts with electrode material 206 to modify at least the resistivity of the electrode material. In the example where electrode material 206 is polycrystalline silicon, the modifying species includes a chemical agent that reacts or combines with silicon such as carbon, nitrogen or oxygen. In one embodiment, the modification is an increase of the resistivity of the electrode material 206 in the local region near the top of the sidewall.

Figure 2E:
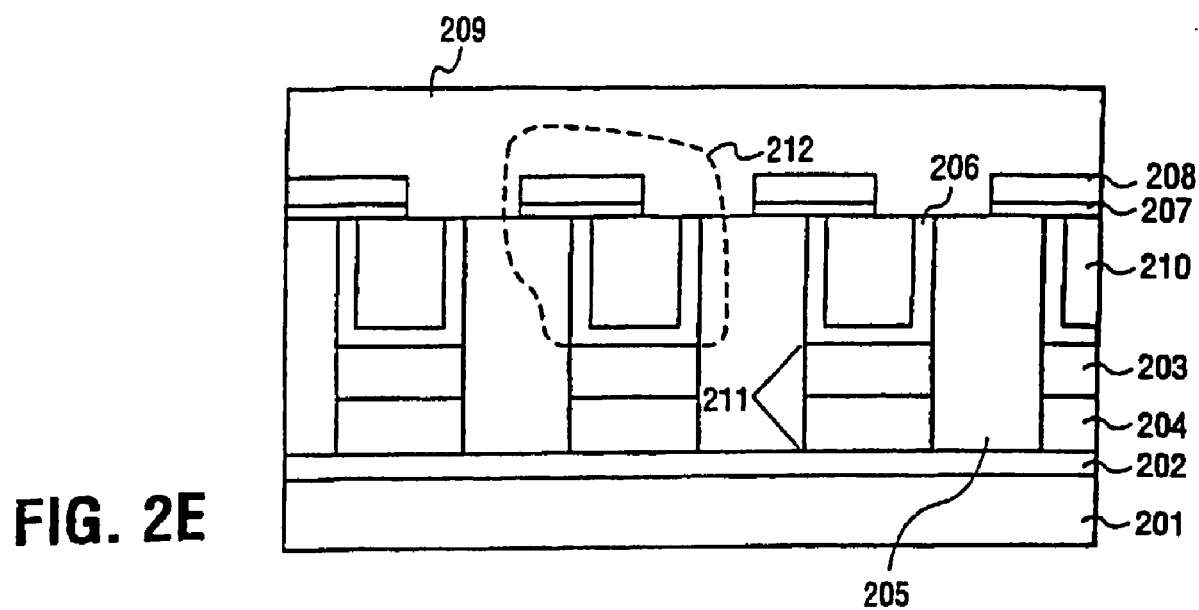
FIG. 2E illustrates the structure of FIG. 2D after formation of the programmable material and insulating layer.

FIG. 2E shows the structure of FIG. 2D after the introduction of a volume of programmable material (represented as memory element 101 in FIG. 1) on electrode material 206 along the first sidewall portion of insulating structures 205. In one example, programmable material 207 is a phase change material. In a more specific example, programmable material 207 includes chalcogenides, examples of which include, but are not limited to, compositions of the class of tellurium-germanium-antimony ($Te_xGe_ySb_z$) material. The volume of programmable material 207, in one example according to current technology, is introduced with a thickness on the order of about 600 Å.

Overlying programmable material 207 is signal line material that along with programmable material 207 are patterned into strips representing reference to FIG. 1, as column lines. In one embodiment, the programmable material 207 is patterned into strips that act as signal lines 208 for the array. Programmable material 207 has a thickness in the range of 50 to 2000 Å, for example 600 Å thick. Signal lines 208 are 50-20,000 Å wide, for example 1800 Å wide. A representative aspect ratio for programmable material 207 and signal lines 208 is 0.33.

In one embodiment, a layer of programmable material is deposited on the insulating structures 205 and 210 and electrode material 206. The layer is subsequently patterned such that the volume of programmable material 207 overlies (as viewed) or is on the modified portion of electrode 206 along the first sidewall portion of insulating structures 205. A conductive material layer formed over programmable material 207 and patterned to form a column address line or signal line 208. In one embodiment, this column signal line is patterned to be generally orthogonal to row address line 202. Column address or signal line 208 may be composed of tungsten (W), aluminum (Al), an aluminum alloy or other similar conductive material. It is to be appreciated at this point that programmable material 207 may be patterned contiguously with second conductor or signal line material 208 such that programmable material 207 is itself strips (like second conductor or signal line material 208) or is in a cellular form (achieved by patterning prior to patterning second conductor or signal line material 208). The components of a memory element such as memory element 101 from FIG. 1 are identified in FIG. 2E with a dotted line 212.

As used herein the terminology "area of contact" is the portion of the surface of an electrical contact through which the electrical contact electrically communicates with programmable material 207. In one embodiment, substantially all electrical communication between programmable material 207 and electrode 206 occurs through all or a portion of an edge of electrode 206. Hence, the area of contact between electrode 206 and programmable material 207 is an edge of electrode or a portion of an edge of the electrode. That is, the area of contact between electrode 206 and programmable material 207 is an "edge portion" of electrode 206. It is noted that electrode 206 need not actually physically contact programmable material 207. It is sufficient that electrode 206 is in electrical communication with programmable material 207. The area of contact, being only an edge portion (i.e., an edge or a portion of an edge) of electrode 206, is thus very small and is proportional to the thickness of electrode 206.

FIG. 2E further shows the structure of FIG. 2D after the introduction of insulator material 209 over second conductor or signal line material 208. Insulator material 209 is, for example, $SiO_2$ or other suitable material that surrounds second conductor or signal line material 208 and programmable material 207 to electronically isolate such structure. In one embodiment, following introduction, insulator material 209 is planarized. Techniques for introducing insulator material 209 and planarizing are known to those skilled in the art.

In the above description of forming a memory element such as memory element 101 in FIG. 1, an electrode is described between a programmable material and conductors or signal lines (e.g., row lines and column lines).

The discussion detailed the formation of one memory element of memory array 100. Other memory elements of memory array 100 may be fabricated in the same manner. It is to be appreciated that many, and possibly all, memory elements of memory array 100, along with other integrated circuit circuitry, may be fabricated simultaneously on an initial layer. This sequence likewise can be repeated to form additional memory cell layers overlying this initial layer using insulation layer 209 as the base layer for the overlying layers.

Referring to FIG. 1, programming memory element 101 (addressed by column line y+1 of columns 111 and row line x+1 of rows x in layer 110) involves, in one example, supplying a voltage to column line y+1 to introduce a current into the volume of memory material 101. The current causes a temperature increase at the volume of memory material 101. To amorphize a volume of memory material, the volume of memory material is heated to a temperature beyond the amorphisizing temperature, $T_M$ (e.g., beyond the melting point of the memory material). A representative amorphisizing temperature for a $Te_xGe_ySb_2$ material is on the order of about 600-650° C. Once a temperature beyond $T_M$ is reached, the volume of memory material is quenched or cooled rapidly (by removing the current flow). The quenching is accomplished at a rate, $t_1$, that is faster than the rate at which the volume of memory material 101 can crystallize so that the volume of memory material 101 retains its amorphous state. To crystallize a volume of memory material 101, the temperature is raised by current flow to the crystallization temperature for the material (representatively a temperature between the glass transition temperature of the material and the melting point) and retained at that temperature for a sufficient time to crystallize the material. After such time, the volume of memory material is quenched (by removing the current flow).

In one embodiment, a read operation is performed similar to a write operation at reduced energy levels to avoid changing stored data values with continuous read cycles. A small current or voltage is formed on the selected column with the selected row brought to a low voltage level. The voltage or current, respectively that develops is a measure of the memory element resistance.

In the preceding example, the volume of memory material 101 was heated to a high temperature to amorphisize the material and reset the memory element (e.g., program 0). Heating the volume of memory material to a lower crystallization temperature crystallizes the material and sets the memory element (e.g., program 1). It is to be appreciated that the association of reset and set with amorphous and crystalline material, respectively, is a convention and that at least an opposite convention may be adopted. It is also to be appreciated from this example that the volume of memory material 101 can be partially set or reset by varying the current flow and duration through the volume of memory material.

Figure 3:
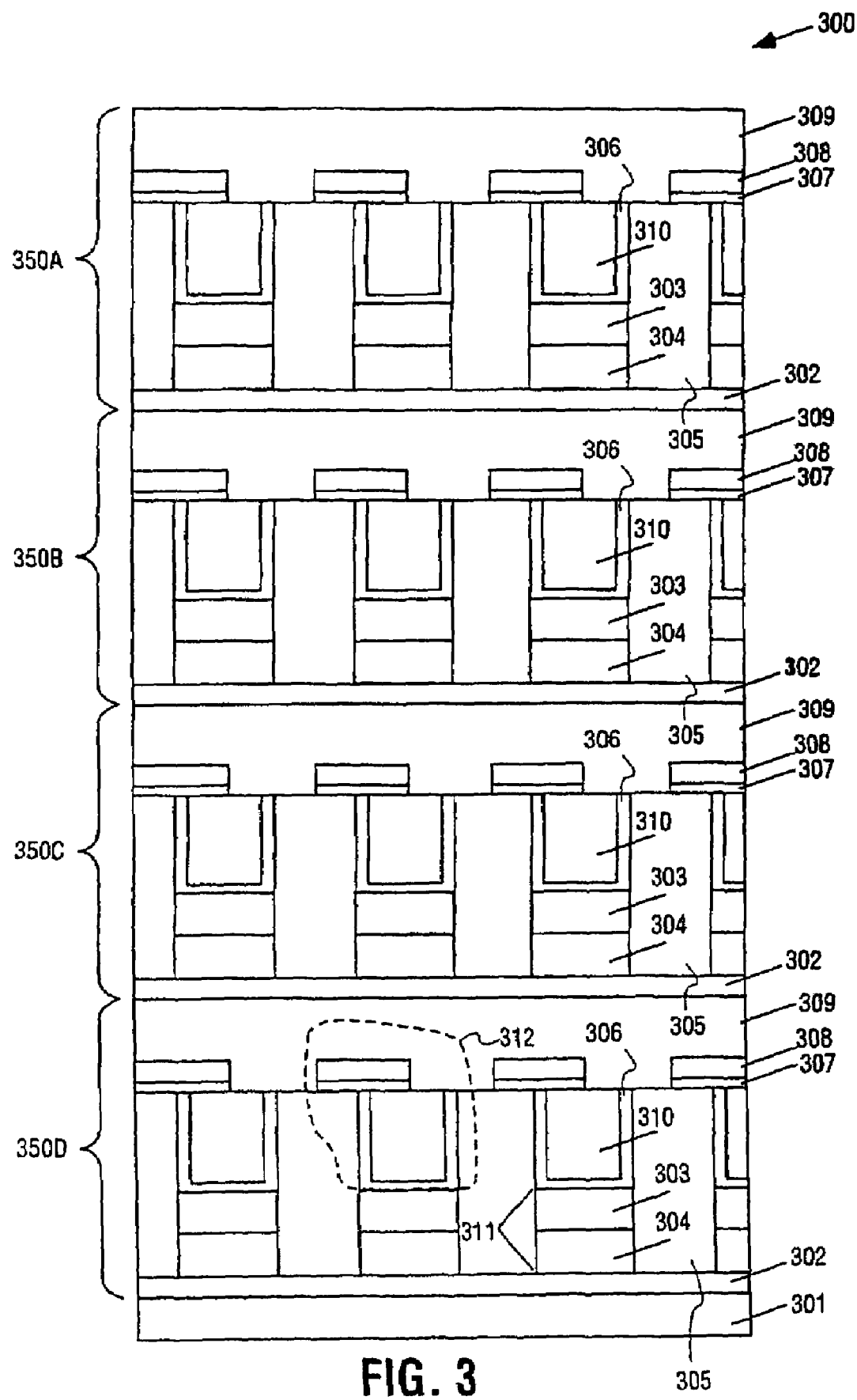
FIG. 3 schematically illustrates a cross-sectional planar side view of a portion of a semiconductor substrate having stacked memory devices.

FIG. 3 illustrates a cross section of a portion of one embodiment of memory device 300 with multiple stacked layers 350A-350D. A stack of four layers is illustrated, nevertheless a memory device may have any number of layers such as layer 350A. Layer 350D corresponds to the layer depicted in FIG. 2E. Layers 350A-C are layers formed overlying initial layer 350D. Thus, in one embodiment the three dimensional array is composed of a base insulator layer 301, row address or signal lines 302, isolation devices 311, memory elements 312, isolation structures 305 and an overlying insulator 309 that is a base layer for an overlying layer. The polycrystalline silicon isolation device 311 includes a P doped layer 303 and a N doped layer 304 as described above. In another embodiment N doped layer 304 overlies the P doped layer 303. The memory element 312 includes electrode material 306, memory material 307 and column address or signal line 308 as described above in reference to FIGS. 2A-E. In one embodiment, memory material 307 is a chalcogenide material, which can be electrically switched between generally amorphous and generally crystalline states. Chalcogenide, as discussed above, exhibits a lower conductivity in its amorphous state than in its crystalline state.

Figure 4:
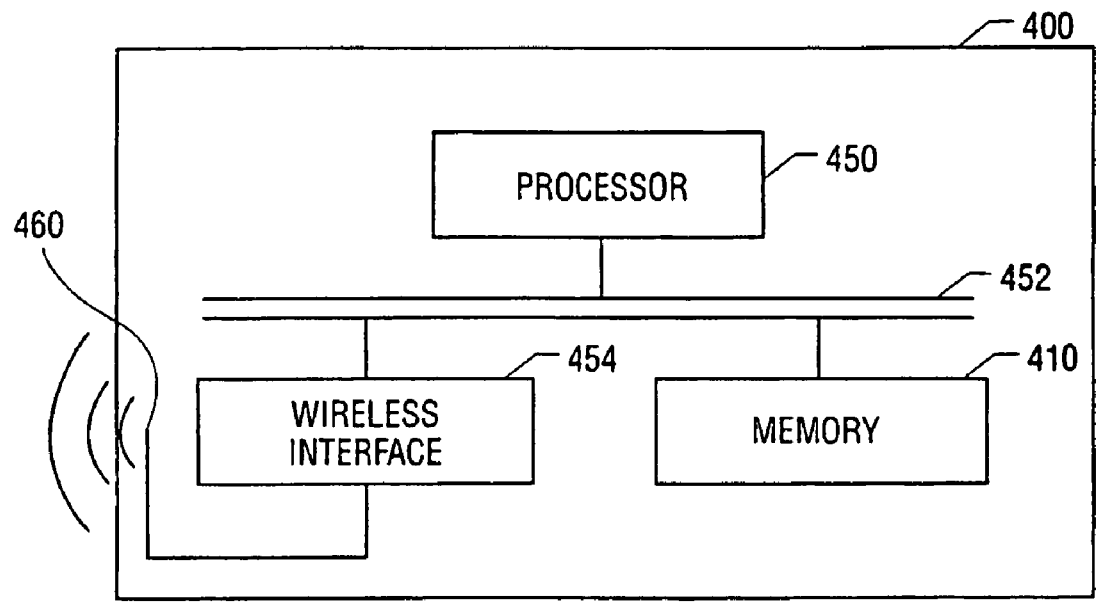
FIG. 4 illustrates a block diagram of a wireless communication device.

FIG. 4 illustrates a wireless communication device 400 including a processor 450 connected to a memory device 410, a wireless interface 454 and an antenna 460 via a bus or similar device. In one embodiment, wireless interface 454 includes hardware and software components that translate data between wireless transmission protocols and higher level protocols, which the processor 450 is configured to manipulate (e.g., formatted data or processor instructions). In one embodiment, the processor is a StrongARM or XScale processor, manufactured by Intel Corporation. In one embodiment, the memory device includes a multiple stacked layer (e.g., three-dimensional) device as illustrated in FIG. 3.

In one embodiment, the bus 452 of FIG. 4 is a logical bus, such that it represents any combination of physical busses, bridges and similar devices that connect the various devices of the system. In one embodiment, the bus 452 is a PCI bus, which enables processor 450 to execute operations affecting memory device 410 (e.g., read and write operations) and wireless interface 454 (e.g., transmit or receive data). In one embodiment, memory device 410 may be accessed by other devices via a direct memory access controller or similar device. A memory device including a multiple stacked layer device could be used in connection with mobile phones, hand held devices, portable computer systems and other similar devices.

Figure 5:
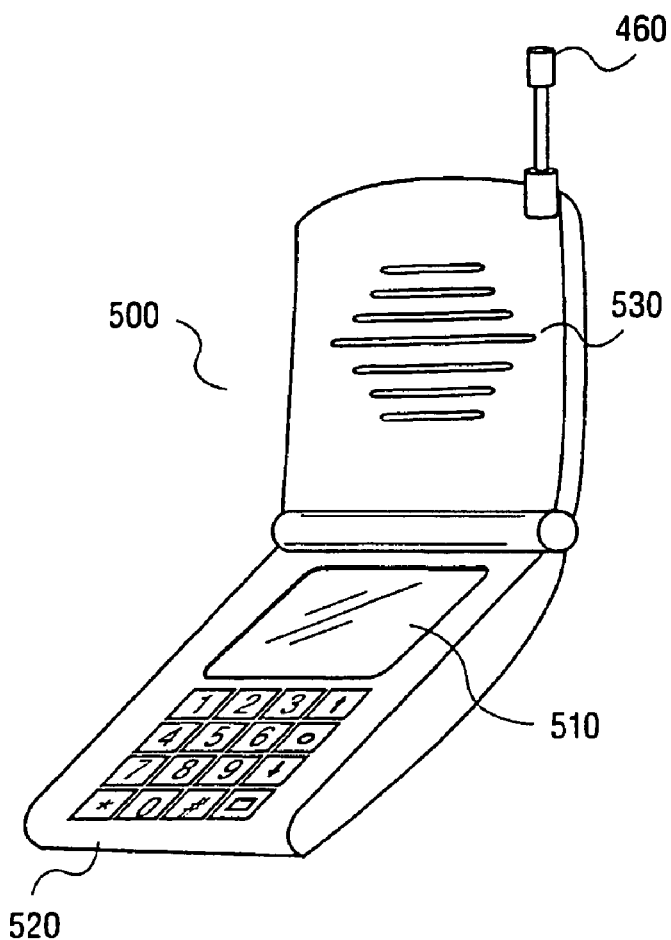
FIG. 5 illustrates a mobile communication device.

In one embodiment, Memory device 410 stores instructions and data for mobile device 500 as illustrated in FIG. 5. Data stored may include firmware, software, image data, video data, user input data or similar information. In one embodiment, mobile device 500 includes a display screen 510 (e.g., video display, LLD, LED or similar devices), input mechanism 520, antenna 460, an audio input device, an audio output device 530 or similar components. In one embodiment, mobile device 500 includes the components of device 400.

In the foregoing specification, specific exemplary embodiments have been described. It would be understood by one of ordinary skill in the art that the embodiments are not discrete and that various combinations and modifications of the embodiments are possible without departing from the broader spirit and scope of the embodiments and appended claims. The specification and drawings are, accordingly, to be regarded in an illustrative rather than a restrictive sense.

What is claimed is:

1. A method comprising:
    forming an array of contacts over a circuit level substrate, a pair of the array of contacts defining a programmable cell plane there being a plurality of cell planes;
    forming between contacts a volume of programmable material coupled to at least one contact by an electrode; and
    modifying the resistance value of less than the entire portion of the electrode.

2. A method of claim 1, further comprising: forming a dielectric layer between the at least one contact and the programmable material in each programmable cell plane, wherein the electrode is formed in the dielectric material.

3. The method of claim 2, wherein the dielectric layer comprises an aspect ratio (height to width) on the order of 2.5:1.

4. The method of claim 3, wherein the electrode in each programmable cell is formed in a via formed in the dielectric layer between the at least one contact and the programmable material, and the electrode comprises two distinct portions only one of which is disposed directly adjacent the volume of programmable material.

5. The method of claim 4, further comprising: forming a base insulation layer such that the base insulation layer is used to support the plurality of programmable cells and isolation elements.

* * * * *